US010847243B2

(12) United States Patent
Shim (10) Patent No.: US 10,847,243 B2
(45) Date of Patent: Nov. 24, 2020

(54) METHODS OF TESTING CELL ARRAYS AND SEMICONDUCTOR DEVICES EXECUTING THE SAME

(71) Applicant: SK hynix Inc., Icheon-si (KR)

(72) Inventor: Young Bo Shim, Dangjin-si Chungcheongnam-do (KR)

(73) Assignee: SK hynix Inc., Icheon-si (KR)

( * ) Notice: Subject to any disclaimer, the term of this patent is extended or adjusted under 35 U.S.C. 154(b) by 53 days.

(21) Appl. No.: 15/605,009

(22) Filed: May 25, 2017

(65) Prior Publication Data

US 2018/0102183 A1    Apr. 12, 2018

(30) Foreign Application Priority Data

Oct. 6, 2016 (KR) ................. 10-2016-0129364

(51) Int. Cl.
| | | |
|---|---|---|
| *G11C 29/38* | (2006.01) | |
| *G11C 29/44* | (2006.01) | |
| *G11C 29/36* | (2006.01) | |
| *G06F 11/10* | (2006.01) | |
| *G11C 29/42* | (2006.01) | |
| *G06F 3/06* | (2006.01) | |
| *G06F 11/263* | (2006.01) | |
| *G06F 11/27* | (2006.01) | |

(Continued)

(52) U.S. Cl.
CPC ............. *G11C 29/38* (2013.01); *G11C 29/36* (2013.01); *G11C 29/44* (2013.01); *G06F 3/0613* (2013.01); *G06F 3/0614* (2013.01); *G06F 11/1012* (2013.01); *G06F 11/1048* (2013.01); *G06F 11/263* (2013.01); *G06F 11/27* (2013.01); *G11C 29/10* (2013.01); *G11C 29/42* (2013.01); *G11C 29/52* (2013.01); *G11C 29/56008* (2013.01); *G11C 2029/3602* (2013.01)

(58) Field of Classification Search
CPC ... G11C 29/42; G11C 29/52; G11C 29/56008; G11C 29/10; G11C 29/38; G11C 29/36; G11C 29/44; G11C 2029/3602; G06F 11/263; G06F 3/0619; G06F 11/1012; G06F 11/1024; G06F 11/1048; G06F 3/0614; G06F 11/27
See application file for complete search history.

(56) References Cited

U.S. PATENT DOCUMENTS 5,986,953 A * 11/1999 Kim ................... G11C 29/48
                                                                365/201
7,318,183 B2    1/2008 Ito et al.
(Continued)

FOREIGN PATENT DOCUMENTS

| CN | 103035302 A | 4/2013 |
| CN | 104425040 A | 3/2015 |

(Continued)

*Primary Examiner* — April Y Blair
*Assistant Examiner* — Sazzad Hossain
(74) *Attorney, Agent, or Firm* — William Park & Associates Ltd.

(57) ABSTRACT

A semiconductor device includes a pattern data generation circuit generating pattern data, a data comparison circuit receiving read data which are outputted from cell arrays included in a core area by a read operation and comparing the read data with the pattern data to generate a fail code, and a fail flag generation circuit comparing the fail code with a set code to generate a fail flag.

15 Claims, 6 Drawing Sheets

(51) Int. Cl.
*G11C 29/10* (2006.01)
*G11C 29/52* (2006.01)
*G11C 29/56* (2006.01)

(56) References Cited

U.S. PATENT DOCUMENTS

| | | |
|---|---|---|
| 9,019,786 B2 | 4/2015 | Choi et al. |
| 2003/0043664 A1* | 3/2003 | Haraguchi ............. G11C 29/44 |
| | | 365/201 |
| 2003/0210594 A1* | 11/2003 | Hamade ................. G11C 29/34 |
| | | 365/201 |
| 2008/0101468 A1* | 5/2008 | Ishikawa ............. H04N 17/004 |
| | | 375/240.12 |
| 2010/0122129 A1* | 5/2010 | Tseng .................... G11C 29/56 |
| | | 714/719 |
| 2013/0173970 A1 | 7/2013 | Kleveland et al. |
| 2015/0026540 A1* | 1/2015 | Hsiao ................. G06F 11/1068 |
| | | 714/773 |

FOREIGN PATENT DOCUMENTS

| | | |
|---|---|---|
| CN | 104464819 A | 3/2015 |
| KR | 20140125981 A | 10/2014 |

\* cited by examiner

FIG.2

| SCD<3> | SCD<2> | SCD<1> | PREDETERMINED NUMBER OF FAILED BITS | ENABLEMENT CONDITION OF FAIL FLAG |
|---|---|---|---|---|
| L | L | H | 1 | NUMBER OF FAILED BITS ≥ 1 |
| L | H | L | 2 | NUMBER OF FAILED BITS ≥ 2 |
| L | H | H | 3 | NUMBER OF FAILED BITS ≥ 3 |
| H | L | L | 4 | NUMBER OF FAILED BITS ≥ 4 |
| H | L | H | 5 | NUMBER OF FAILED BITS ≥ 5 |
| H | H | L | 6 | NUMBER OF FAILED BITS ≥ 6 |
| H | H | H | 7 | NUMBER OF FAILED BITS ≥ 7 |

METHODS OF TESTING CELL ARRAYS AND SEMICONDUCTOR DEVICES EXECUTING THE SAME

CROSS-REFERENCE TO RELATED APPLICATIONS

The present application claims priority under 35 U.S.C 119(a) to Korean Application No. 10-2016-0129364, filed on Oct. 6, 2016, which is incorporated herein by reference in its entirety as though fully set forth herein.

BACKGROUND

1. Technical Field

Embodiments of the present disclosure relate to methods of testing cell arrays and, more particularly, to methods of testing cell arrays and semiconductor devices executing the same.

2. Related Art

Recently, a DDR2 scheme or a DDR3 scheme of receiving and outputting four bit data or eight bit data during each clock cycle time has been used to improve operating speed of semiconductor devices. As the data transmission speed of the semiconductor device becomes faster, the probability that errors might occur increases during data transmission. Accordingly, novel design schemes have been proposed to improve the reliability of the data transmission.

Whenever data is transmitted in semiconductor devices, error codes which are capable of detecting the occurrence of errors may be generated and transmitted with the data to improve the reliability of data transmission. That is, error correction circuits have been used to improve the reliability of data transmission.

SUMMARY

In an embodiment in accordance with the present invention, a semiconductor device includes a pattern data generation circuit generating pattern data, a data comparison circuit receiving read data outputted from cell arrays included in a core area by a read operation, and comparing the read data with the pattern data to generate a fail code, and a fail flag generation circuit comparing the fail code with a set code to generate a fail flag.

According to another embodiment, a semiconductor device includes a memory circuit and a failure test circuit. The memory circuit includes cell arrays in which write data are stored by a write operation, and the memory circuit outputs data stored in the cell arrays as read data during a read operation. The failure test circuit compares the read data with pattern data generated in response to the write data to determine the number of failed bits included in the read data. In addition, the failure test circuit generates a fail flag which is enabled if the number of the failed bits included in the read data is equal to or greater than a set number of failed bits.

According to yet another embodiment, a method of testing a cell array includes storing write data into a core area, generating pattern data, outputting the write data stored in the core area as read data, and comparing the read data with the pattern data to generate a fail flag.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION

Hereinafter, embodiments in accordance with the present invention will be explained in more detail with reference to the accompanying drawings. Although the present invention is described with reference to a number of example embodiments thereof, it should be understood that numerous other modifications and variations may be devised by one skilled in the art that will fall within the spirit and scope of the invention.

Figure 1:
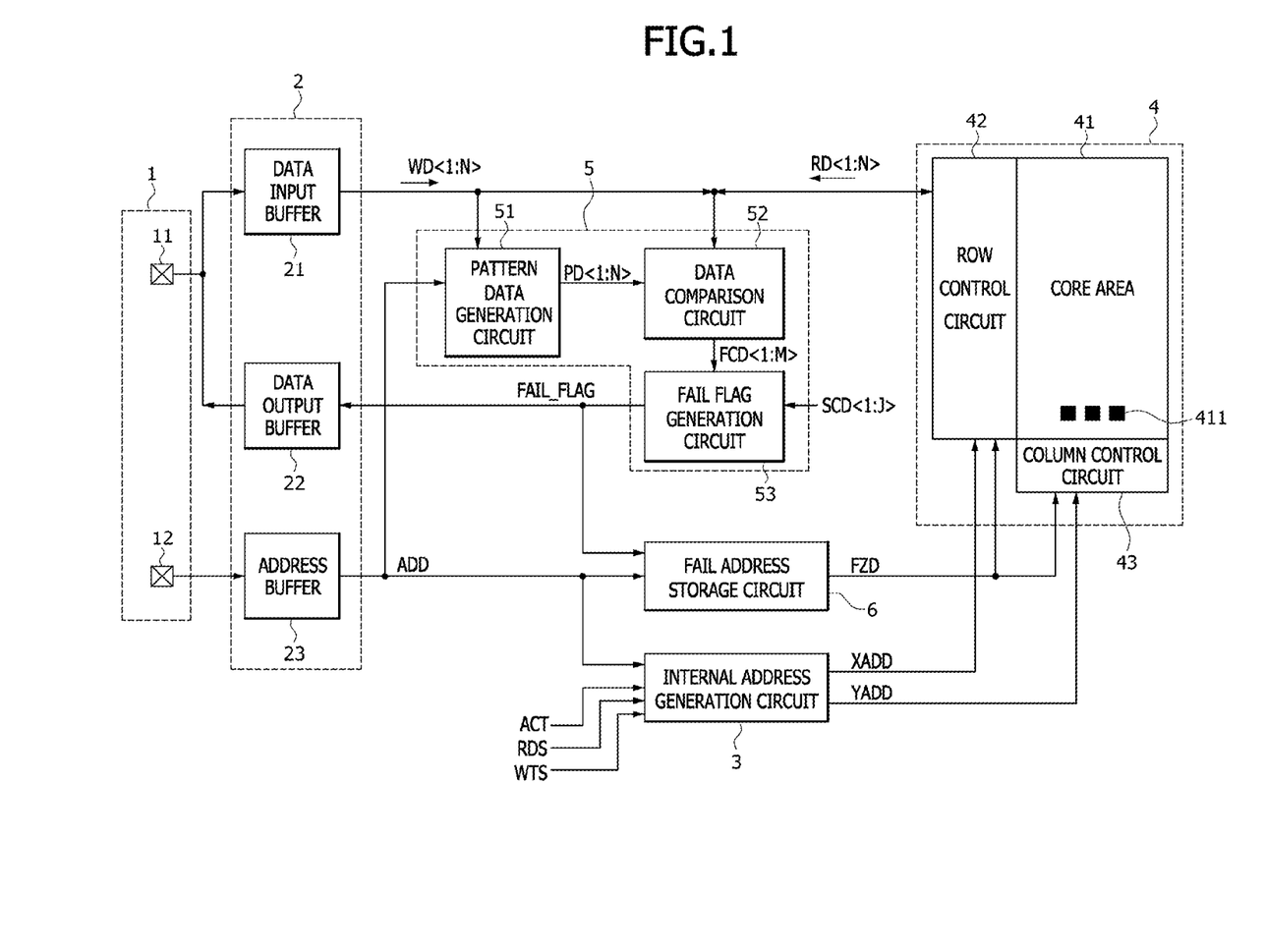
FIG. 1 is a block diagram illustrating a configuration of a semiconductor device according to an embodiment.

As illustrated in FIG. 1, a semiconductor device in an embodiment in accordance with the present invention may include a pad circuit 1, a buffer circuit 2, an internal address generation circuit 3, a memory circuit 4, a failure test circuit 5 and a fail address storage circuit 6. The pad circuit 1 may include a first pad 11 and a second pad 12.

The buffer circuit 2 may include a data input buffer 21, a data output buffer 22 and an address buffer 23.

The data input buffer 21 may generate write data WD<1:N> to be stored in a core area 41 of the memory circuit 4 if a write operation is performed. The write data WD<1:N> may be generated by buffering external data (not shown) which is inputted through the first pad 11. The data input buffer 21 may be realized using a data buffer circuit.

The data output buffer 22 may buffer a fail flag FAIL_FLAG in order to output the buffered fail flag through the first pad 11. The point in time when the buffered fail flag is outputted from the data output buffer 22 may differ from one embodiment to another.

The address buffer 23 may generate an internal address ADD for accessing a cell array included in the core area 41. The internal address ADD may be generated by buffering an external address (not shown) which is inputted through the second pad 12. The internal address ADD may be generated to include a plurality of bits according to the embodiments.

The internal address generation circuit 3 may generate a row address XADD and a column address YADD from the internal address ADD in response to an active signal ACT, a read signal RDS and a write signal WTS. The active signal ACT may be enabled for an active operation that activates any one of the word lines included in the core area 41. The read signal RDS may be enabled for a read operation that outputs data stored in the cell array included in the core area 41. The write signal WTS may be enabled for a write operation that stores the data into the cell array included in the core area 41. The active signal ACT, the read signal RDS and the write signal WTS may be generated by decoding an external command (not shown). In some embodiments, the active signal ACT, the read signal RDS and the write signal WTS may be internally generated to execute the active operation, the read operation and the write operation of the cell array included in the core area 41, while a test operation is performed to verify and repair failures of the cell array. The row address XADD and the column address YADD may be set to include a plurality of bits according to the embodiments.

The memory circuit 4 may include the core area 41, a row control circuit 42 and a column control circuit 43.

The core area 41 may include a plurality of cell arrays. The plurality of cell arrays included in the core area 41 may be selected by word lines which are activated during the active operation. The plurality of cell arrays included in the core area 41 may store data during a write operation, when the plurality of cell arrays are selected by the active operation. The plurality of cell arrays included in the core area 41 may output the stored data during a read operation, when the plurality of cell arrays are selected by the active operation. The plurality of cell arrays of the core area 41 may include redundancy cell arrays (not shown) comprised of redundancy cells for replacing failed cells in normal cell arrays 411 during a repair operation.

The row control circuit 42 may activate word lines included in the cell arrays of the core area 41 to access the memory cells connected to the word lines, in response to the row address XADD, and fuse data FZD, when an active operation is performed. The row control circuit 42 may access normal cell arrays 411 or redundancy cell arrays (not shown) included in the core area 41, according to a logic level combination of bits included in the row address XADD and a logic level combination of bits included in the fuse data FZD during performance of an active operation.

The column control circuit 43 may store the write data WD<1:N> into the cell arrays included in the core area 41 in response to the column address YADD and the fuse data FZD when a write operation is performed. The column control circuit 43 may store the write data WD<1:N> into the normal cell arrays 411 or the redundancy cell arrays (not shown) included in the core area 41 according to a logic level combination of bits included in the column address YADD, and a logic level combination of bits included in the fuse data FZD, during the write operation. The column control circuit 43 may output read data RD<1:N> stored in the cell arrays of the core area 41 in response to the column address YADD and the fuse data FZD when a read operation is performed. The memory circuit 4 having a column control circuit 43 may output the read data RD<1:N> stored in the normal cell arrays 411, or the redundancy cell arrays (not shown), included in the core area 41, according to a logic level combination of bits included in the column address YADD and a logic level combination of bits included in the fuse data FZD during the read operation.

The failure test circuit 5 may include a pattern data generation circuit 51, a data comparison circuit 52 and a fail flag generation circuit 53.

The pattern data generation circuit 51 may generate pattern data PD<1:N> in response to the write data WD<1:N> or the internal address ADD. The write data WD<1:N> may be generated during the write operation. The internal address ADD may be generated during the write operation or the read operation. The pattern data generation circuit 51 may generate the pattern data PD<1:N> during the read operation. A logic level combination of the pattern data PD<1:N> may be set to be identical to a logic level combination of the write data WD<1:N> which are stored into the cell arrays included in the core area 41 during the write operation.

The data comparison circuit 52 may receive the read data RD<1:N> and compare the read data RD<1:N> with the pattern data PD<1:N> to generate a fail code FCD<1:M>. The data comparison circuit 52 may generate the fail code FCD<1:M> having a logic level combination that is counted by the number of different bits between the read data RD<1:N> and the pattern data PD<1:N>. For example, the fail code FCD<1:3> may be generated to have a logic level combination of 'L,L,L' if the read data RD<1:N> and the pattern data PD<1:N> have the same logic level combination. The fail code FCD<1:3> may be generated to have a logic level combination of 'L,L,H' if the number of different bits between the read data RD<1:N> and the pattern data PD<1:N> is only one, and the fail code FCD<1:3> may be generated to have a logic level combination of 'L,H,L' if the number of different bits between the read data RD<1:N> and the pattern data PD<1:N> is two. In the fail code FCD<1:3>, a logic level combination of 'L,L,H' means that a first bit FCD<1> of the fail code FCD<1:3> has a logic "high" level, and both of the second and third bits FCD<2:3> of the fail code FCD<1:3> have a logic "low" level. The fail code FCD<1:M> may have a logic level combination corresponding to the number of failed bits included in the read data RD<1:N>. The number "M" of bits included in the fail code FCD<1:M> may differ according to the embodiments.

The fail flag generation circuit 53 may compare the fail code FCD<1:M> with a set code SCD<1:J> to generate a fail flag FAIL_FLAG. The fail flag generation circuit 53 may generate the fail flag FAIL_FLAG, which is enabled if the number of failed bits in the read data RD<1:N>, evaluated by the fail code FCD<1:M>, is greater than or equal to the number of failed bits set by the set code SCD<1:J>. In some embodiments, the fail flag generation circuit 53 may generate the fail flag FAIL_FLAG, which is enabled if the number of the failed bits in the read data RD<1:N>, evaluated by the fail code FCD<1:M>, is equal to or greater than the number of failed bits set by the set code SCD<1:J>. The number "M" of bits included in the fail code FCD<1:M> may be set to be equal to or different from the number "3" of bits included in the set code SCD<1:J>, depending upon the particular embodiment. The set code SCD<1:J> may be a signal provided by an external device (not shown), or internally generated and stored during an initialization operation, to set the number of failed bits.

The fail address storage circuit 6 may store the internal address ADD in response to the fail flag FAIL_FLAG. The fail address storage circuit 6 may store in the fail address storage circuit 6 the internal address ADD corresponding to the cell array having failures (i.e., failed cells) when the fail flag FAIL_FLAG is enabled. The fail address storage circuit 6 may generate the fuse data FZD based on the stored internal address ADD and may output the fuse data FZD. The fuse data FZD may include information on the address of the cell array having failed cells, so that the repair operation may be executed on the failed cells.

Figure 2:
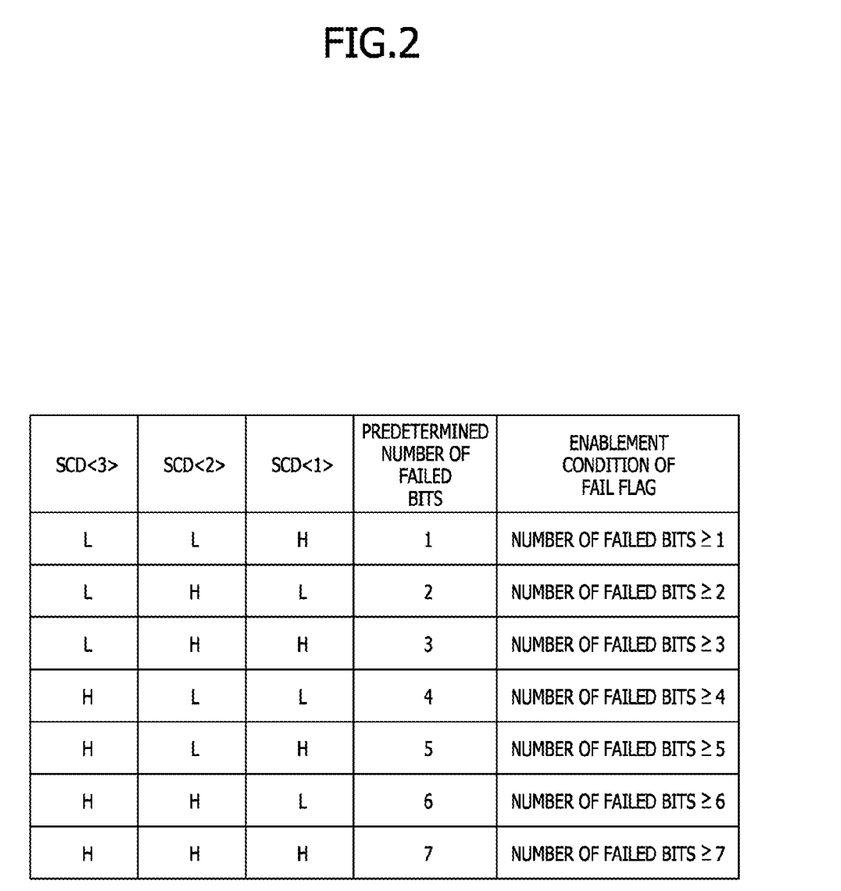
FIG. 2 is a table illustrating an operation for generating a fail flag according to a predetermined number of failed bits in the semiconductor device of FIG. 1.

FIG. 2 illustrates various enablement conditions of the fail flag FAIL_FLAG according to the set code SCD<1:J>. As shown in FIG. 2, if the set code SCD<1:J> is set to have three bits, the enablement conditions of the fail flag FAIL_FLAG, according to various logic level combinations of the set code SCD<1:3>, are listed.

If the set code SCD<1:3> has a logic level combination of 'L,L,H', the number of failed bits may be set to be one. In such a case, if the number of failed bits included in the read data RD<1:N> is equal to or greater than one, the fail flag FAIL_FLAG may be enabled. In the set code SCD<1:3>, a logic level combination of 'L,L,H' means that a first bit SCD<1> of the set code SCD<1:3> has a logic "high" level and both of the second and third bits SCD<2:3> of the set code SCD<1:3> have a logic "low" level.

If the set code SCD<1:3> has a logic level combination of 'L,H,L', the number of failed bits may be set to be two. In such a case, if the number of failed bits included in the read data RD<1:N> is equal to or greater than two, the fail flag FAIL_FLAG may be enabled. In the set code SCD<1:3>, a logic level combination of 'L,H,L' means that both of the first and third bits SCD<1> and SCD<3> of the set code SCD<1:3> have a logic "low" level, and the second bit SCD<2> of the set code SCD<1:3> has a logic "high" level.

If the set code SCD<1:3> has a logic level combination of 'L,H,H', the number of failed bits may be set to be three. In such a case, if the number of failed bits included in the read data RD<1:N> is equal to or greater than three, the fail flag FAIL_FLAG may be enabled. In the set code SCD<1:3>, a logic level combination of 'L,H,H' means that both of the first and second bits SCD<1:2> of the set code SCD<1:3> have a logic "high" level and the third bit SCD<3> of the set code SCD<1:3> has a logic "low" level.

If the set code SCD<1:3> has a logic level combination of 'H,L,L', the number of failed bits may be set to be four. In such a case, if the number of failed bits included in the read data RD<1:N> is equal to or greater than four, the fail flag FAIL_FLAG may be enabled. In the set code SCD<1:3>, a logic level combination of 'H,L,L' means that both of the first and second bits SCD<1:2> of the set code SCD<1:3> have a logic "low" level and the third bit SCD<3> of the set code SCD<1:3> has a logic "high" level.

If the set code SCD<1:3> has a logic level combination of 'H,L,H', the number of failed bits may be set to be five. In such a case, if the number of failed bits included in the read data RD<1:N> is equal to or greater than five, the fail flag FAIL_FLAG may be enabled. In the set code SCD<1:3>, a logic level combination of 'H,L,H' means that both of the first and third bits SCD<1> and SCD<3> of the set code SCD<1:3> have a logic "high" level and the second bit SCD<2> of the set code SCD<1:3> has a logic "low" level.

If the set code SCD<1:3> has a logic level combination of 'H,H,L', the number of failed bits may be set to be six. In such a case, if the number of failed bits included in the read data RD<1:N> is equal to or greater than six, the fail flag FAIL_FLAG may be enabled. In the set code SCD<1:3>, a logic level combination of 'H,H,L' means that the first bit SCD<1> of the set code SCD<1:3> has a logic "low" level and both of the second and third bits SCD<2:3> of the set code SCD<1:3> have a logic "high" level.

If the set code SCD<1:3> has a logic level combination of 'H,H,H', the number of failed bits may be set to be seven. In such a case, if the number of failed bits included in the read data RD<1:N> is equal to or greater than seven, the fail flag FAIL_FLAG may be enabled. In the set code SCD<1: 3>, a logic level combination of 'H,H,H' means that all of the bits included in the set code SCD<1:3> have a logic "high" level.

Figure 3:
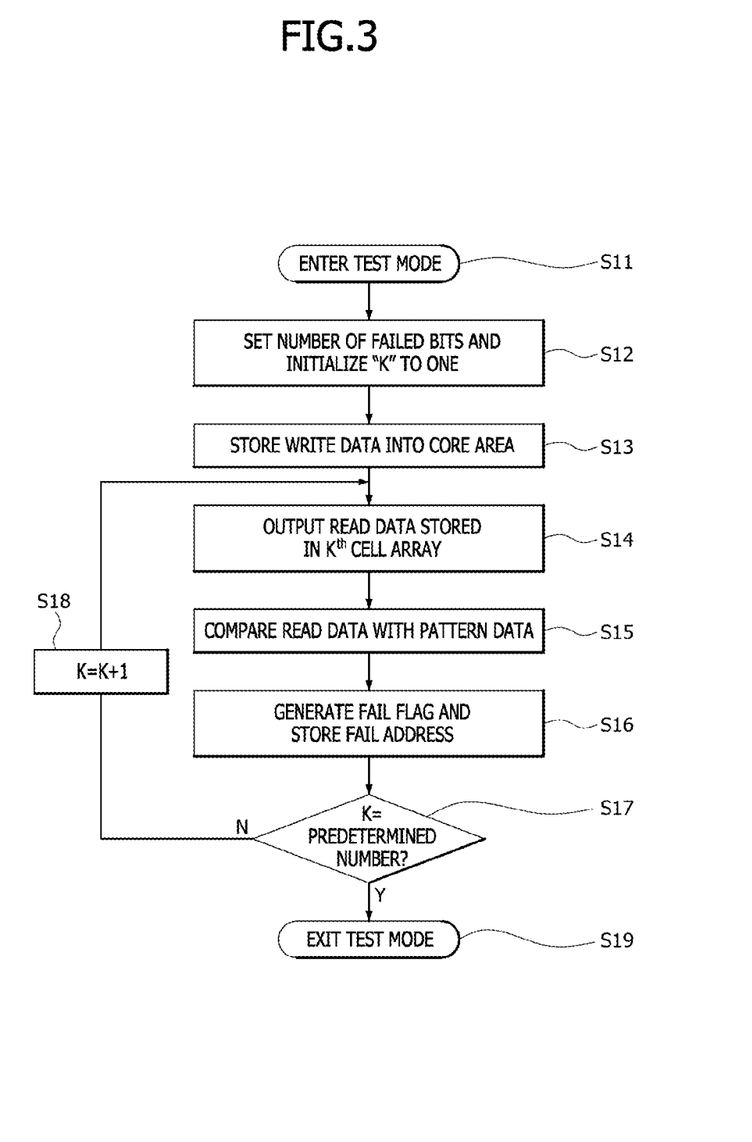
FIG. 3 is a flowchart illustrating an operation of the semiconductor device shown in FIG. 1.

FIG. 3 depicts a method of testing the cell arrays of the core area 41 (as shown in FIG. 1).

First, when the semiconductor device of FIG. 1 enters a test mode (step S11), the number of failed bits may be set by the set code SCD<1:J>, and a number "K" may be initialized to one in step S12. As described with reference to FIG. 2 above, the number of failed bits may be set to be different according to a logic level combination of the set code SCD<1:J>.

The write data WD<1:N> may be stored in all of the cell arrays included in the core area 41 (step S13). The cell arrays included in the core area 41 may be sequentially selected by the row address XADD and the column address YADD, which are generated in response to the active signal ACT and the write signal WTS, and the selected cell array may receive and store the write data WD<1:N>.

The data stored in a $K^{th}$ cell array among the cell arrays may be outputted as the read data RD<1:N> (step S14). The $K^{th}$ cell array included in the core area 41 may be selected by the row address XADD and the column address YADD, which are generated in response to the active signal ACT and the read signal RDS, and the write data WD<1:N> stored in the selected $K^{th}$ cell array of the core area 41 may be outputted as the read data RD<1:N>.

The pattern data PD<1:N> may be generated and the read data RD<1:N> outputted from the $K^{th}$ cell array may be compared with the pattern data PD<1:N> in step S15. As a result of the comparison between the read data RD<1:N> and the pattern data PD<1:N>, the fail code FCD<1:M> including the information on the number of failed bits in the read data RD<1:N> may be generated.

If the number of failed bits included in the read data RD<1:N> is greater than or equal to the set number of failed bits determined in step S12, the fail flag FAIL_FLAG enabled may be generated, and the internal address ADD may be stored as a fail address (step S16). The fail flag FAIL_FLAG may be outputted to the first pad 11.

Next, the number "K" may be compared with a predetermined number (step S17), and the number "K" may increase by one if the number "K" is not equal to the predetermined number (see a step S18). In such a case, the steps S14, S15, S16 and S17 may be iterated until the increased number "K" is equal to the predetermined number. The predetermined number compared with the number "K" may correspond to the number of cell arrays included in the core area 41. That is, the test procedure from step S14 to step S17 may be applied to each of the cell arrays included in the core area 41, so that failed cells in all of the cell arrays are detected by the read data RD<1:N>, and the fail addresses corresponding to the failed cells may be stored if the number of failed bits in the read data RD<1:N> is greater than the set number of failed bits. If the number "K" is equal to the predetermined number at step S17, the test mode may terminate (see step S19). If the test mode terminates, the repair operation may be performed based on the information included in the fail flag FAIL_FLAG outputted to the first pad 11, or based on the internal address ADD stored in the fail address storage circuit 6.

Figure 4:
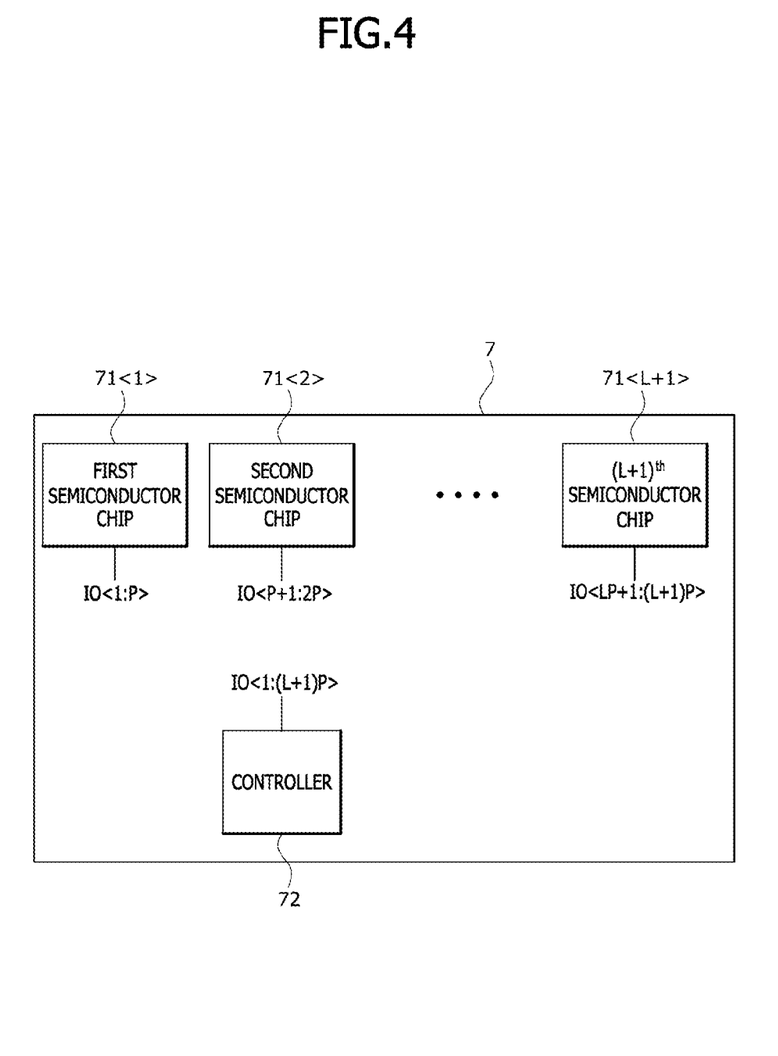
FIG. 4 is a block diagram illustrating an example of a semiconductor module employing the semiconductor device shown in FIG. 1.

FIG. 4 illustrates that a semiconductor module 7 may include first to $(L+1)^{th}$ semiconductor chips 71<1:(L+1)> and a controller 72. Each of the first to $(L+1)^{th}$ semiconductor chips 71<1:(L+1)> may include P input/output (I/O) lines through which data are transmitted. That is, the first semiconductor chip 71<1> may include first to $P^{th}$ I/O lines IO<1:P>, the second semiconductor chip 71<2> may include $(P+1)^{th}$ to $(2P)^{th}$ I/O lines IO<P+1:2P>, and the $(L+1)^{th}$ semiconductor chip 71<L+1> may include $(LP+1)^{th}$ to $(L+1)P^{th}$ I/O lines IO<LP+1:(L+1)P>. The controller 72 may include first to $(L+1)P^{th}$ I/O lines IO<1:(L+1)P> to exchange data with the first to $(L+1)^{th}$ semiconductor chips 71<1:(L+1)>. The controller 72 may include an error correction circuit using an error correction code (ECC) scheme to correct errors included in the data which are outputted from the first to $(L+1)^{th}$ semiconductor chips 71<1:(L+1)>, and to use the corrected data. Each of the first to $(L+1)^{th}$ semiconductor chips 71<1:(L+1)> may include the semiconductor device illustrated in FIG. 1. None of the first to $(L+1)^{th}$ semiconductor chips 71<1:(L+1)> includes an error correction circuit like the error correction circuit that is included in the controller 72, but each of the first to $(L+1)^{th}$ semiconductor chips 71<1:(L+1)> may perform a test operation in a test mode to detect failed cell arrays, and may repair the failed cell arrays.

Figure 5:
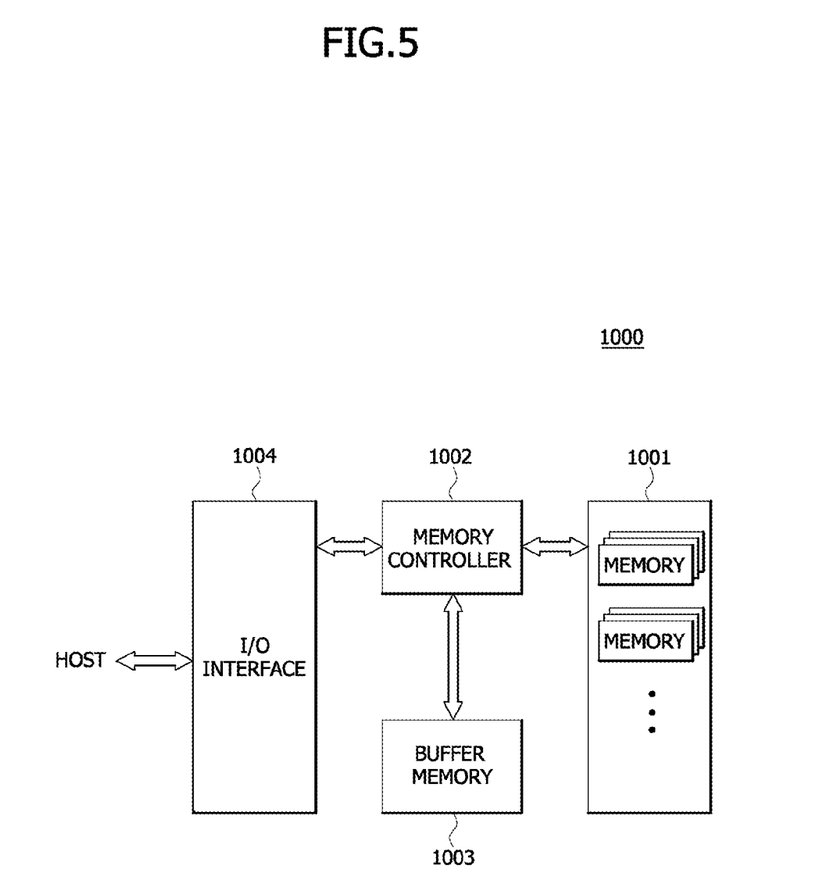
FIG. 5 is a block diagram illustrating a configuration of an electronic system employing the semiconductor device shown in FIG. 1.

The semiconductor device described with reference to FIG. 1 may be part of an electronic system that includes a memory system, a graphic system, a computing system, a mobile system, or the like. For example, as illustrated in FIG. 5, an electronic system 1000 according to an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include the semiconductor device illustrated in FIG. 1. The data storage circuit 1001 may further include a nonvolatile memory that can retain its stored data even when its power supply is interrupted. The nonvolatile memory may be a flash memory, such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001, or the buffer memory 1003, or for outputting the data stored in the data storage circuit 1001 or the buffer memory 1003. Although FIG. 5 illustrates the memory controller 1002 with a single block, the memory controller 1002 may include one controller for controlling the data storage circuit 1001 comprised of a nonvolatile memory, and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

Figure 6:
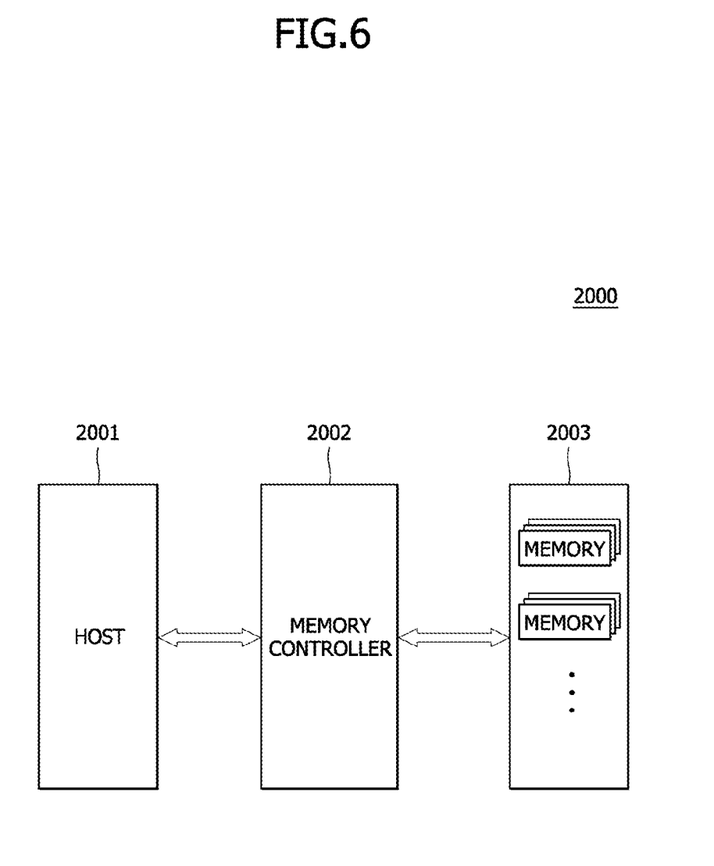
FIG. 6 is a block diagram illustrating a configuration of another electronic system employing the semiconductor device shown in FIG. 1.

FIG. 6 depicts yet another electronic system 2000 according to a further embodiment, which may include a host 2001, a memory controller 2002 and a data storage circuit 2003.

The host 2001 may output a request signal and data to the memory controller 2002 to access the data storage circuit 2003. The memory controller 2002 may supply the data, a data strobe signal, a command, addresses, and a clock signal to the data storage circuit 2003 in response to the request signal, and the data storage circuit 2003 may execute a write operation or a read operation in response to the command. The host 2001 may transmit the data to the memory controller 2002 to store the data into the data storage circuit 2003. In addition, the host 2001 may receive the data outputted from the data storage circuit 2003 through the memory controller 2002. The host 2001 may include a circuit that corrects errors of the data using an error correction code (ECC) scheme.

The memory controller 2002 may act as an interface that connects the host 2001 to the data storage circuit 2003 for communication between the host 2001 and the data storage circuit 2003. The memory controller 2002 may receive the request signal and the data outputted from the host 2001 and may generate and supply the data, the data strobe signal, the command, the addresses, and the clock signal to the data storage circuit 2003, in order to control operations of the data storage circuit 2003. In addition, the memory controller 2002 may supply the data outputted from the data storage circuit 2003 to the host 2001.

The data storage circuit 2003 may include a plurality of memories. The data storage circuit 2003 may receive the data, the data strobe signal, the command, the addresses, and the clock signal from the memory controller 2002 to execute the write operation or the read operation. Each of the memories included in the data storage circuit 2003 may include a circuit that corrects the errors of the data using an error correction code (ECC) scheme. The data storage circuit 2003 may include the semiconductor device illustrated in FIG. 1.

In some embodiments, the electronic system 2000 may be realized to selectively operate any one of the ECC circuits included in the host 2001 and the data storage circuit 2003. Alternatively, the electronic system 2000 may be realized to simultaneously operate all of the ECC circuits included in the host 2001 and the data storage circuit 2003. The host 2001 and the memory controller 2002 may be realized in a single chip according to the embodiments. The memory controller 2002 and the data storage circuit 2003 may be realized in a single chip according to the embodiments.

As described above, a semiconductor device according to an embodiment may detect failed cell arrays in a wafer test mode or a package test mode even without employing an error correction circuit using an ECC scheme.

In addition, according to the embodiment, addresses of the failed cell arrays may be stored to perform repair operations of the failed cell arrays. Thus, the yield of the semiconductor device may be improved.

While certain embodiments have been described above, it will be understood by those skilled in the art that the embodiments described are by way of example only. Accordingly, the testing methods for cell arrays described herein should not be limited based on the described embodiments. Rather, the testing methods for cell arrays described herein should only be limited in light of the claims that follow, when taken in conjunction with the above description and accompanying drawings.

What is claimed is:

1. A semiconductor device comprising:
   a pattern data generation circuit configured to generate pattern data in response to write data and a first internal address;
   a data comparison circuit configured to receive read data which are outputted from cell arrays included in a core area of the semiconductor device by a read operation, and configured to compare the read data with the pattern data to generate a fail code;
   a fail flag generation circuit configured to compare the fail code with a set code to generate a fail flag, wherein the set code is a signal which is received by the semiconductor device from an external device that is not part of the semiconductor device in order to set the number of failed bits, wherein the write data is inputted through a first pad when a write operation is performed, wherein the first internal address is inputted through a second pad when the write operation is performed; and
   a fail address storage circuit configured to store a second internal address therein in response to the fail flag and configured to generate fuse data to execute a repair operation of the cell arrays included in the core area in response to the stored second internal address.

2. The semiconductor device of claim 1, wherein the pattern data
   are set to have the same logic level combination as the write data which are inputted to the
   core area during the write operation.

3. The semiconductor device of claim 1, wherein the fail code has
   a logic level combination corresponding to the number of failed bits included in the read
   data.

4. The semiconductor device of claim 1, wherein the fail flag
   generation circuit generates the fail flag which is enabled, if the number of the failed bits
   included in the read data is equal to or greater than the set number of failed bits which
   is determined by the set code.

5. A semiconductor device comprising:
   a memory circuit configured to include cell arrays in which write data are stored by a write operation and configured to output data stored in the cell arrays as read data during a read operation;
   a failure test circuit configured to compare the read data with pattern data generated in response to the write data and first internal address to find out the number of failed bits included in the read data and configured to generate a fail flag which is enabled if the number of the failed bits included in the read data is equal to or greater than a set number of failed bits, wherein the set number of failed bits is set by a set code, wherein the set code is received by the semiconductor device from a set code source that is external to and not part of the semiconductor device, in order to set the number of failed bits, wherein the write data is inputted through a first pad when the write operation is performed, wherein the first internal address is inputted through a second pad when the write operation is performed; and
   a fail address storage circuit configured to store a second internal address therein in response to the fail flag and configured to generate fuse data to execute a repair operation of the cell arrays included in the core area in response to the stored second internal address.

6. The semiconductor device of claim 5, wherein the pattern data are set to have the same logic level combination as the write data.

7. The semiconductor device of claim 5, wherein the failure test circuit includes:
   a pattern data generation circuit configured to generate the pattern data;
   a data comparison circuit configured to receive the read data outputted from the cell arrays included in the memory circuit by the read operation and configured to compare the read data with the pattern data to generate a fail code; and
   a fail flag generation circuit configured to compare the fail code with the set code to generate the fail flag.

8. The semiconductor device of claim 7, wherein the fail code has
   a logic level combination corresponding to the number of the failed bits included in the read data.

9. The semiconductor device of claim 7, wherein the fail flag generation circuit generates the fail flag which is enabled, if the number of the failed bits included in the read data is equal to or greater than the set number of failed bits.

10. A method of testing cell arrays of a semiconductor memory device, the method comprising:
    storing write data into a core area;
    generating pattern data in response to write data and a first internal address;
    outputting the write data stored in the core area as read data;
    comparing the read data with the pattern data to generate a fail flag; and
    storing a second internal address in a fail address storage circuit in response to the fail flag and generating fuse data to execute a repair operation of the cell arrays included in the core area in response to the stored second internal address,
    wherein the number of failed bits is set by a set code; and
    wherein the set code is provided by device that is external to and which is not
    part of the semiconductor memory device, in order to set the number of failed bits,
    wherein the write data is inputted through a first pad when a write operation is performed, wherein the first internal address is inputted through a second pad when the write operation is performed.

11. The method of claim 10, wherein the pattern data are set to have the same logic level combination as the write data to be stored into the core area during the write operation.

12. The method of claim 10, further comprising setting the number of failed bits, wherein the fail flag is enabled if the number of failed bits included in the read data is equal to or greater than the set number of failed bits.

13. The method of claim 10, wherein comparing the read data with
the pattern data to generate the fail flag includes comparing the read data with the pattern data to generate a fail code; and
generating the fail flag from the fail code.

14. The method of claim 13, wherein the fail code is generated to have a logic level combination corresponding to the number of the failed bits included in the read data.

15. The method of claim 13, wherein generating the fail flag from the fail code includes comparing the fail code with the set code to generate the fail flag.

* * * * *